United States Patent
Choi et al.

(10) Patent No.: US 12,176,229 B2
(45) Date of Patent: Dec. 24, 2024

(54) APPARATUS OF STORING CARRIERS AND METHOD OF STORING CARRIERS

(71) Applicant: SEMES CO., LTD., Cheonan-si (KR)

(72) Inventors: Yong Bae Choi, Seoul (KR); Ji Hyun Park, Daegu (KR); Shin Young Cheong, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 589 days.

(21) Appl. No.: 17/466,270

(22) Filed: Sep. 3, 2021

(65) Prior Publication Data

US 2022/0076974 A1  Mar. 10, 2022

(30) Foreign Application Priority Data

Sep. 7, 2020  (KR) .......................... 10-2020-0113739

(51) Int. Cl.
   *H01L 21/673* (2006.01)
(52) U.S. Cl.
   CPC .............................. *H01L 21/67389* (2013.01)
(58) Field of Classification Search
   CPC ......... H01L 21/67253; H01L 21/67769; H01L 21/67389
   USPC ....................................................... 414/269
   See application file for complete search history.

(56) References Cited

U.S. PATENT DOCUMENTS

| | | | |
|---|---|---|---|
| 2008/0156069 A1* | 7/2008 | Murata | G01D 21/00 73/19.04 |
| 2016/0329225 A1* | 11/2016 | Bachlechner | H01L 21/67769 |
| 2020/0083078 A1* | 3/2020 | Kinoshita | H01L 21/67259 |
| 2020/0105561 A1* | 4/2020 | Yoon | H01L 21/67393 |
| 2020/0180864 A1* | 6/2020 | Tsubaki | H01L 21/67373 |

FOREIGN PATENT DOCUMENTS

| | | |
|---|---|---|
| KR | 10-2018-0000094 | 1/2018 |
| KR | 10-2020-0047639 | 5/2020 |

OTHER PUBLICATIONS

Korean Office Action with English translation for Korean Patent Application No. 10-2020-0113739, dated May 30, 2023.

* cited by examiner

*Primary Examiner* — Glenn F Myers
(74) *Attorney, Agent, or Firm* — KILE PARK REED & HOUTTEMAN PLLC

(57) ABSTRACT

An apparatus of storing container includes a stocker including shelves being configured to support containers, respectively, a purging unit being configured to provide a purge gas for each of the shelves to purge the containers when the stocker is in a purge mode, and to provide the purge gas only for each of the shelves when the stocker is in a normal mode, an inspection unit being configured to inspect a purge quality of the purge gas provided to each of the shelves while the stocker is in the normal mode, and a control unit being configured to change the stocker between in the purge mode and in the normal mode, and being configured to control the purging unit according to a switch between the purge mode and the normal mode. Thus, the apparatus has improved operation efficiency.

20 Claims, 5 Drawing Sheets

APPARATUS OF STORING CARRIERS AND METHOD OF STORING CARRIERS

CROSS-REFERENCE TO RELATED APPLICATION

This application claims priority to Korean Patent Application No. 10-2020-0113739, filed on Sep. 7, 2020 and all the benefits accruing therefrom under 35 U.S.C. § 119, the contents of which are incorporated by reference in their entirety.

TECHNICAL FIELD

The present disclosure relates to an apparatus for storing carrier, and a method of storing carriers. More particularly, the present disclosure relates to an apparatus for storing containers on shelves, respectively and a method of storing containers on shelves, respectively.

BACKGROUND

In general, a plurality of semiconductor processing apparatuses for manufacturing a semiconductor device is sequentially arranged to perform various processes on a semiconductor substrate. An object such as the semiconductor substrate against which the semiconductor processing apparatuses perform the semiconductor device manufacturing process may be provided in a state accommodated in a container into each of the semiconductor processing apparatuses, or may be retracted from each of the semiconductor processing apparatuses in the state accommodated in the container. An example of the container includes a front opening unified pod (hereinafter, referred as FOUP), a front opening shipping box (hereinafter, referred as FOSB), a magazine, a reticle pod, and the like.

The container may be transported by vehicle included in an Overhead Hoist Transport (hereinafter, referred as OHT). The vehicle may transport the container in which the object is accommodated to s load port of each of the semiconductor processing apparatuses, and may pick up the container in which the processed object is accommodated from the load port and transports the container outside.

A plurality of containers may be temporality stored on shelves included in a stocker in order for the vehicle to transport the containers efficiently. When the containers are loaded on the shelves, the containers may be purged with a purge gas as a purging process in order either to remove fume or gas remaining in the containers or to prevent an oxide film from being formed on the object accommodated in each of the containers. However, it may be unnecessary to purge the containers depending on a type of the container or the object.

The stocker may operate both in a purge mode in which the purging process is performed and in a normal mode in which the purging process stops.

When the stocker goes back to the purging mode again from the normal mode, it may be necessary to check whether the purging process could be properly performed, as called as a purge quality inspection process.

Since the purge quality inspection process is performed in a state in which stopping loading on the shelves, the stocker having the shelves cannot operate, and thus, the stocker may have a poor efficiency. In addition, since the operator may manually inspect the purge quality with stepping on each shelf, it may take a lot of time and much cost to inspect the purge quality.

SUMMARY

The embodiments of the present invention provides an apparatus of storing container, capable of switching a stocker from a normal mode to a purge mode with automatically checking a quality of a purge process using a purge gas for purging the container.

The embodiments of the present invention provides a method of storing container, capable of switching a stocker from a normal mode to a purge mode with automatically checking a quality of a purge process using a purge gas for purging the container.

According to example embodiments of the present invention, disclosed is an apparatus of storing container. The apparatus includes a stocker including a plurality of shelves being configured to support containers, respectively, a purging unit being configured to provide a purge gas for each of the shelves to purge the containers when the stocker is in a purge mode, and to provide the purge gas only for each of the shelves when the stocker is in a normal mode, an inspection unit being configured to inspect a purge quality of the purge gas provided to each of the shelves while the stocker is in the normal mode, and a control unit being configured to change the stocker between in the purge mode and in the normal mode according to an inspection result of the inspection unit in relation to the each of the shelves, and being configured to control the purging unit according to a switch between the purge mode and the normal mode.

In an example embodiment, the purging unit may provide the purge gas only to empty shelves among all of the shelves, on which the containers are not loaded, respectively, to prevent the purge gas from being supplied into the containers in the normal mode.

Here, the inspection unit may inspect the purge quality in relation to the empty shelves.

Further, the stocker may include a transfer robot being configured to transfer the carriers, the control unit controls the transfer robot to transfer the containers loaded on occupied shelves from the occupied shelves to transform the occupied shelves to new empty shelves, and the inspection unit further inspects the purge quality in relation to the new empty shelves.

Furthermore, the inspection unit may inspect the purge quality in relation to the empty shelves for a predetermined period of time, and in case when the occupied shelves are not transformed to the new empty shelves for the predetermined period of time, the control unit controls the transfer robot to transfer the containers from the occupied shelves.

On the other hand, transforming the occupied shelves to new empty shelves may include transferring the containers from the occupied shelves either to the empty shelves where the inspection unit completes a purge quality inspection process, or out of the stocker.

In an example embodiment, the inspection unit may include a plurality of pressure sensor, each being provided in each of supply lines for supplying the purge gas to the each of the shelves and measuring a pressure of the purge gas, a plurality of flow sensors, each being provided in each of the supply lines and measuring a flow rate of the purge gas, and a plurality of determiners, each being configured to determine whether the purge quality in relation to the each of shelves is normal in case when each of values of the pressure and the flow rate of the purge gas is within a normal range.

In an example embodiment, the control unit may classify the shelves into a plurality of shelf group, and may control the inspection unit to inspect the purge quality against a selected shelf group at a regular interval.

Here, the control unit may select one of the shelf groups to be inspected according to priority criteria which are set in order of either the largest number of shelves included in a specific shelf group or the largest number of empty shelves in the specific shelf group.

In an example embodiment, the apparatus may further include a display unit being configured to display whether each of the shelves are either in the purge mode or in the normal mode, whether the inspection unit performs a purge quality inspection process in relation to the each of the shelves in the normal mode, and what a result of the purge inspection process is.

According to example embodiments of the present invention, disclosed is a method of storing carriers, the method includes inspecting a purge quality of a purge gas provided to each of shelves in a normal mode in which the purge gas is provided only to the each of the shelves included in a stocker, and switching the each of the shelves from the normal mode to a purge mode in which the purge gas is provided into containers being supported by some of the shelves, considering a result of a purge quality inspection in relation to the each of the shelves.

In an example embodiment, the purge gas may be provided only to empty shelves among all of the shelves, on which the containers are not loaded, to prevent the purge gas from being provided into the containers.

Here, inspecting a purge quality of each of the shelves may include inspecting a first purge quality in relation to each of the empty shelves, transferring the containers from occupied shelves to transform the occupied shelves to new empty shelves, and inspecting a second purge quality in relation to the new empty shelves.

Further, inspecting the first purge quality in relation to empty shelves may be performed for a predetermined period of time, and in case when the occupied shelves are not changed to the new empty shelves within the predetermined period of time, the containers are transferred from the occupied shelves to transform the occupied shelves to the new empty shelves.

Furthermore, transferring the containers from the occupied shelves may include transferring the containers either to the empty shelves on the condition of completing inspecting the purge quality, or out of the stocker.

In the meantime, inspecting a first purge quality in relation to each of empty shelves may include supplying a purge gas to perform a purge process to the empty shelves, measuring a pressure and a flow rate of the purge gas provided to the empty shelves, and determining whether the purge quality in relation to the each of the empty shelves is normal in case when each of values of the pressure and the flow rate of the purge gas is within a normal range.

Here, switching the each of the shelves from the normal mode to the purge mode may be performed against only the shelves each whose purge quality is determined to be normal.

In an example embodiment, the shelves may be classified as a plurality of shelf group, and inspecting a purge quality of a purge gas provided to each of shelves includes inspecting the purge quality against the shelves included in a selected shelf group at a regular interval.

Here, the selected shelf group may be decided according to priority criteria which are set in order of either the largest number of shelves included in a specific shelf group or the largest number of empty shelves in the specific shelf group.

According to example embodiments of the present invention, disclosed is a method of storing carriers, the method includes inspecting a purge quality of a purge gas provided to each of empty shelves in a normal mode in which the purge gas is provided only to each of shelves included in a stocker, switching the each of the empty shelves from the normal mode to a purge mode in which the purge gas is provided into containers being supported by some of the empty shelves, considering a result of the purge quality inspection in relation to the each of the shelves, and displaying whether the each of empty shelves are in the purge mode or the normal mode, whether a purge quality inspection process in relation to the each of the shelves in the normal mode is completed, and what a result of the purge inspection process is.

According to example embodiments of the apparatus and method of storing container, the inspection unit may be capable of inspecting the purge quality while the stocker is in the normal mode. Further, the stocker is switched from the normal mode to the purge mode in accordance with a result of the purge quality inspection step.

Since the stocker may not be required to stop for inspecting the purge quality while changing the mode of the stocker, the apparatus of storing container may have improved operation efficiency of the stocker.

In addition, while changing the stocker from the normal mode to the purge mode, the purge quality inspection process may not be required additionally, so that the time and cost for the additional purge quality inspection process can be saved.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Example embodiments can be understood in more detail from the following description taken in conjunction with the accompanying drawings, in which.

DETAILED DESCRIPTION

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

Hereinafter, specific embodiments on a raceway unit and an OHT having the same will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. In the figures, the dimensions of layers and regions are exaggerated for clarity of illustration.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
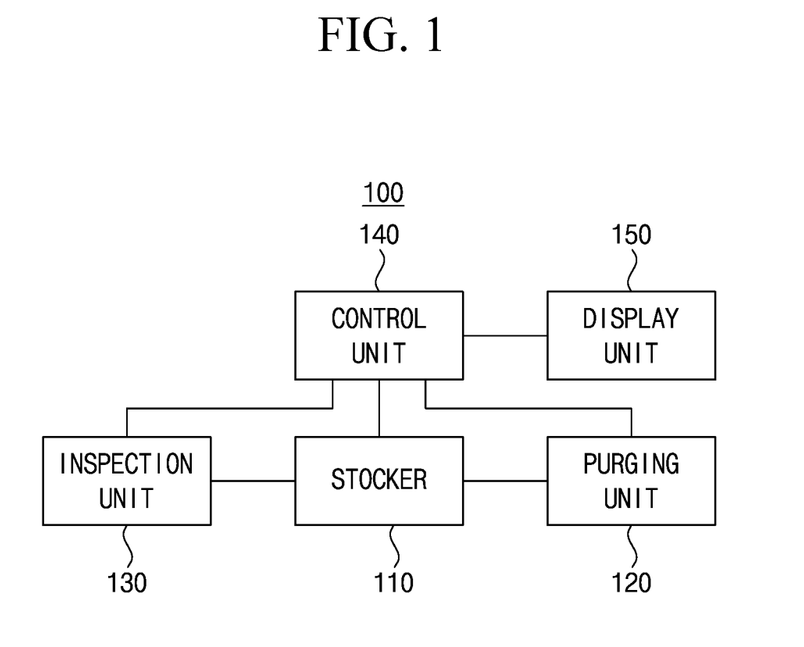
FIG. 1 is a block diagram illustrating an apparatus of storing carrier in accordance with an embodiment of the present invention.
Figure 2:
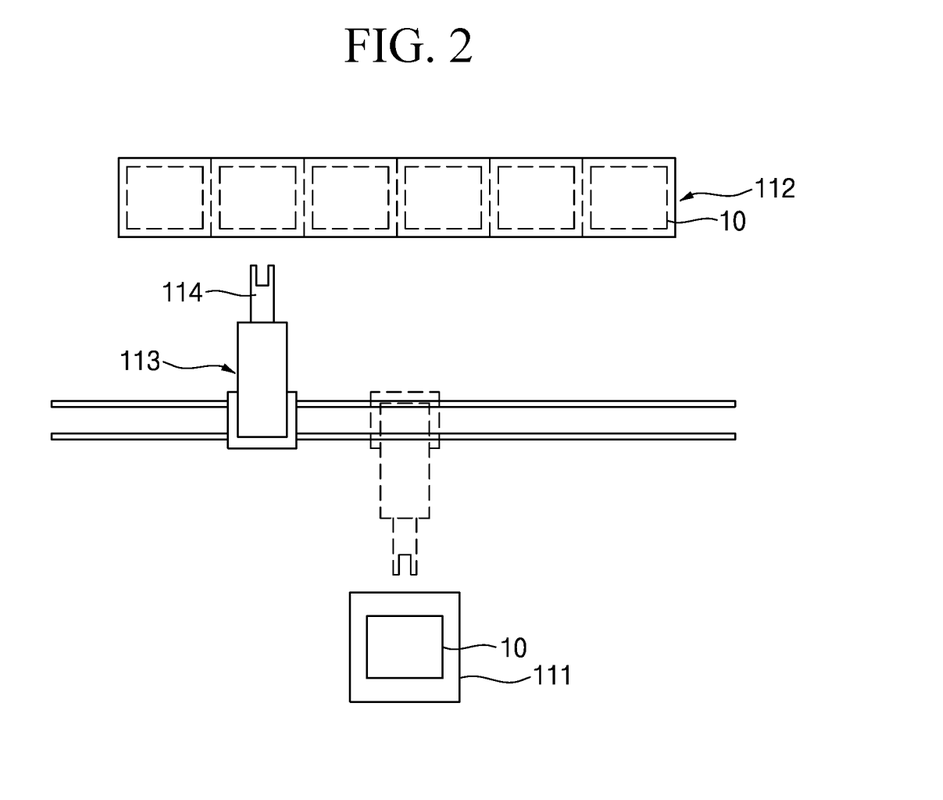
FIG. 2 is a plan view illustrating the stocker in FIG. 1.
Figure 3:
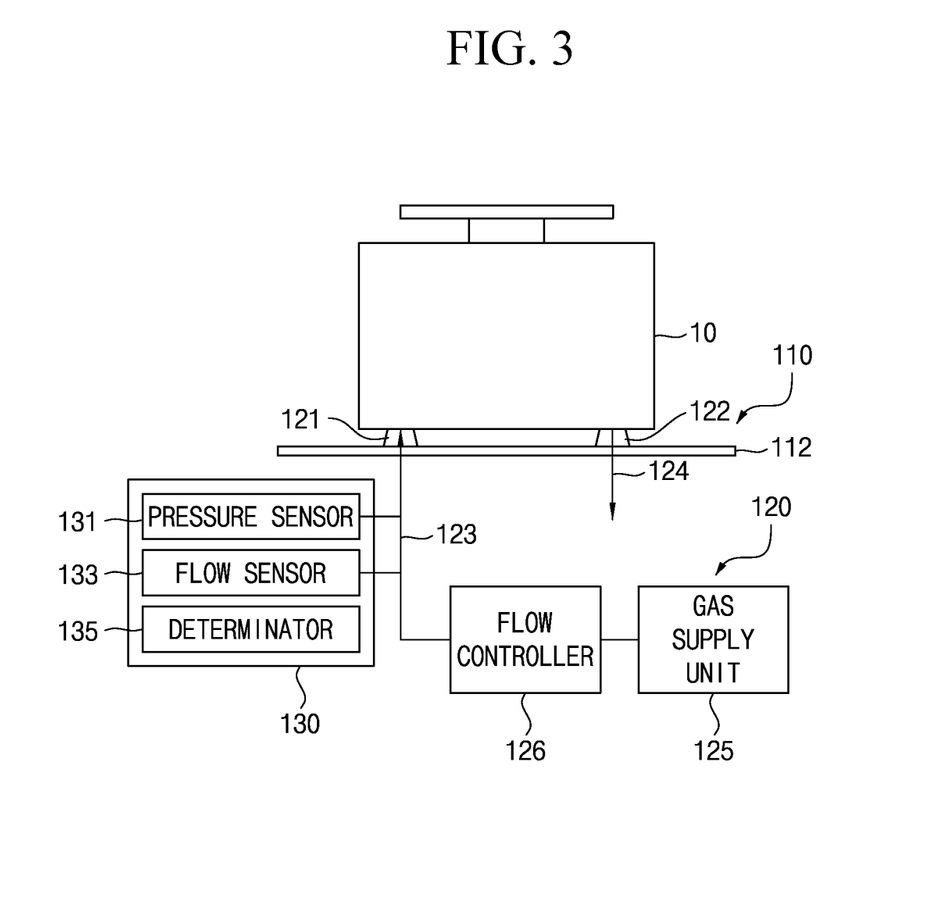
FIG. 3 is a front view illustrating the stocker, the purging unit and the inspection unit in FIG. 1.
Figure 4:
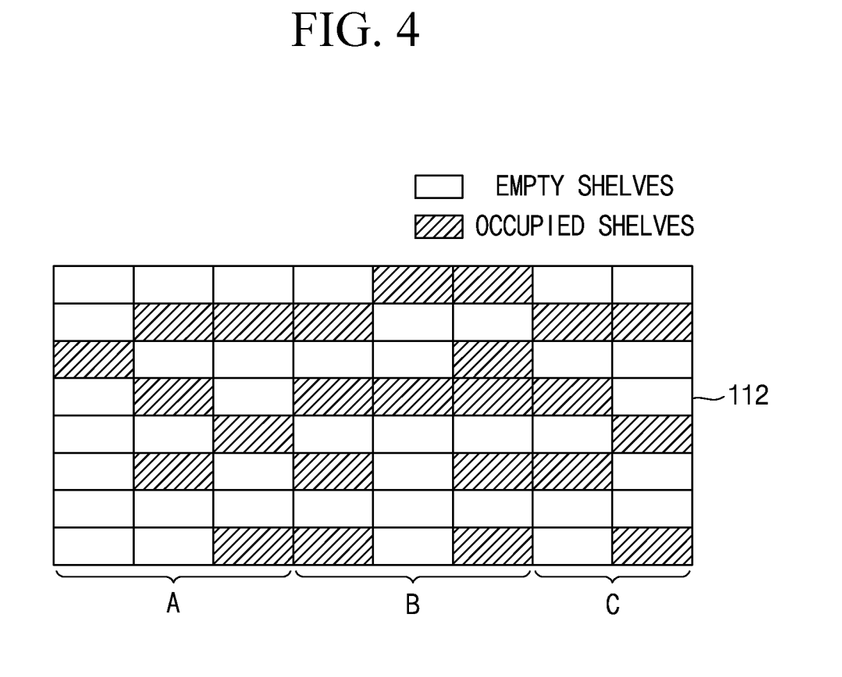
FIG. 4 is a front view illustrating a plurality of shelf group included in the stocker in FIG. 1.

FIG. 1 is a block diagram illustrating an apparatus of storing carrier in accordance with an embodiment of the present invention. FIG. 2 is a plan view illustrating the stocker in FIG. 1. FIG. 3 is a front view illustrating the stocker, the purging unit and the inspection unit in FIG. 1. FIG. 4 is a front view illustrating a plurality of shelf group included in the stocker in FIG. 1.

Referring to FIGS. 1 to 4, an apparatus 100 of storing carrier according to an embodiment of the present invention includes a stocker 110, a purging unit 120, an inspection unit 130, a control unit 140 and a display unit 150.

The stocker 110 includes a load port 111, a plurality of shelves 112 and a transfer robot 113.

The load port 111 may receive containers 10 from a transfer unit (not shown). Further, the transfer unit may pick up the containers 10 from the load port 111. The load port 111 may provide a space in which the containers 10 are supported. The containers 10 in which an object (not shown) is accommodated, are positioned on the load port 111. Example of each of the container 10 includes a FOUP, a FOSB, a magazine, a reticle pod, and the like. The object may include a semiconductor substrate, a printed circuit board, a reticle, etc.

Each of the shelves 112 may be configured to store each of the containers 10. The shelves 112 may be arranged in both a horizontal direction and a vertical direction. Although the shelves 112 are depicted to be arranged in one row in FIG. 2, the shelves 112 may be arranged in at least two rows parallel to each other.

The transfer robot 113 is disposed in front of the shelves 112, and the transfer robot 113 may transfer the containers 10 between the load port 111 and the shelves 112. When the shelves 112 are arranged parallel to each other in two rows, the transfer robot 113 may be arranged between the two rows of shelves 112.

The transfer robot 113 may be capable of either moving in the horizontal direction and the vertical direction or rotating for transferring the containers 10. Although not shown in detail, the transfer robot 113 includes a horizontal driving unit for moving a robot arm 114 in the horizontal direction, a vertical driving unit for moving the robot arm 114 in the vertical direction, and a rotation driving unit for rotating the robot arm 114.

In detail, the transfer robot 113 may include the robot arm 114 for holding the containers 10, and the robot arm 114 may be configured to be movable toward the shelves 112.

For example, the robot arm 114 may be configured to be movable in a front-rear direction perpendicular to a left-right direction. The horizontal driving unit may drive the robot arm 114 to move in both the front-rear driving unit and the left-right direction. The robot arm 114 may include a multi-joint robot arm that can be extended and retracted.

In an example embodiment, each of the horizontal driving unit, the vertical driving unit and the rotation driving unit may be configured to include a motor and a power transmission device having a timing belt and pulleys.

Accordingly, the transfer robot 113 may load the containers 10 on the shelves 112 or transfer the containers 10 from the shelves 112.

On the other hand, the transfer robot 113 may be provided in a plural form to transfer the containers 10 more quickly.

The purging unit 120 may perform a purging process by providing a purge gas to each of the shelves 112 included in the stocker 110.

Referring to FIG. 3, the purging unit 120 may include supply nozzles 121, discharge nozzles 122, supply pipes 123, discharge pipes 124, a gas supply unit 125 and a flow rate controller 126.

The supply nozzles 121 are respectively provided on the shelves 112. Each of the supply nozzles 121 has an end portion to make contact with a lower surface of each of the containers 10. For example, the supply nozzles 121 may be opened and closed using a pressing force which may occur when each of the containers 10 presses the end portion of each of the supply nozzles 121. That is, when one of the containers 10 is loaded on one of the shelves 112, one of the supply nozzles 121 may be in an open state due to the pressing force which occurs when the one of the containers 10 presses the end portion of the one of the supply nozzles 121. On the other hand, when one of the containers 10 is unloaded from one of the shelves 112, the pressing force of the container 10 which presses the end portion of one of the supply nozzles 121 becomes released, so that the supply nozzles 121 may change into a closing state.

The discharge nozzles 122 are respectively provided on each of the shelves 112. The discharge nozzles 122 may make contact with an upper portion of the lower surface of each of the container 10. For example, one of the discharge nozzles 122 may switch between in the open state and in the closing state using the pressing force of the one of the containers 10 which may occur when the one of the containers presses the upper portion of one of the discharge nozzles 122.

The supply pipes 123 connect the supply nozzles 121 of the purging unit 120 to the gas supply part 125. A purge gas may be supplied into the containers 10 through the supply pipes 123 and the supply nozzles 121.

The discharge pipes 124 are connected to the discharge nozzles 122 of the purging unit 120. The purge gas may be discharged from the container 10 through the discharge nozzles 122 and the discharge pipes 124.

The gas supply unit 125 may store the purge gas, and may supply the purge gas to the containers 10 through the supply pipes 123. An example of the purge gas may include nitrogen gas.

The flow rate controller 126 is provided on one of the supply pipes 123 and may control the flow rate of the purge gas which flows through the supply pipes 123. For example, a plurality of flow control units 126 may be provided to each of the supply pipes 123, and each of the flow control units 126 may control a flow rate of the purge gas which is to be provided for the plurality of the shelves 112.

The purging unit 120 may purge an inner space of each of the containers 10 with the purge gas. Accordingly, the purging unit 120 may remove fumes which remain in the inner space of each of the containers 10 or may prevent an oxide film from forming on a surface of the object accommodated in each of the containers 10.

The inspection unit 130 may inspect a purge quality of the purge gas by checking about how properly the purge unit 120 purges the inner space of each of shelves 112.

The inspection unit 130 may include a pressure sensor 131, a flow sensor 133, and a determiner 135.

The pressure sensor 131 may be provided adjacent to one of the shelves 112. For example, the pressure sensor 131 may be provided adjacent to one of the supply nozzles 121 or may be provided adjacent to one of the supply pipes 123. The pressure sensor 131 may measure a pressure of the purge gas which flows toward the one of the shelves 112 for purging the one of the shelves 112.

The flow sensor 133 may be provided adjacent to one of the shelves 112. For example, the flow sensor 133 may be provided adjacent to one of the supply nozzles 121 or provided adjacent to one of the supply pipes 123. The flow sensor 133 may measure a flow rate of the purge gas which flows toward the one of the shelves 112 for purging the one of the shelves.

The determiner 135 is connected to both the pressure sensor 131 and the flow sensor 133, and determines whether the pressure and the flow rate of the purge gas, which the pressure sensor 131 and the flow sensor 133 measure, respectively, are in a normal range.

For example, when the pressure and the flow rate of the purge gas measured by the pressure sensor 131 and the flow sensor 133 are within the normal range in relation to each of the shelves 112, the purge quality is determined as a normal state, whereas if the pressure and the flow rate are out of the normal range, the purge quality may be determined as an abnormal state.

The control unit 140 may control the stocker 110, the purging unit 120, the inspection unit 130 and the display unit 150.

Specifically, the control unit 140 may control the stocker 110 to alternately switch the stocker 110 between a purge mode in which the purging process is performed and a normal mode in which the purging process is not performed.

Also, the control unit 140 may control the purging unit 120 when the stocker 110 is alternately switched between the purge mode and the normal mode. When the stocker 110 is in the purge mode, the purging unit 120 provides the purge gas to each of the shelves 112 for purging the inner spaced of each of the containers 10. When the stocker 110 is changed in the normal mode, the purging unit 120 provides the purge gas only into each of the shelves 112 such that the inner space of each of the containers 10 are not purged.

The control unit 140 may control the inspection unit 130 to inspect the purge quality in relation to each of the shelves 112 when the stocker 110 is in the normal mode. Further, the control unit 140 may quickly change the stocker 110 from the normal mode to the purge mode in accordance with a purge quality inspection result.

Further, while switching the stocker 110, especially one of the shelves 112, from the normal mode to the purge mode, the stocker 110 may not be required entirely to stop such that the stocker 110 may have improved operation efficiency.

While the stocker 110 is changed from the normal mode to the purge mode, an additional purge quality inspection process may be not required such that a time and a cost for performing the additional purge quality inspection process may be saved.

Meanwhile, in the normal mode, a purging process is not performed against all of the shelves even though the containers 10 are loaded on the shelves Meanwhile, it is in the normal mode of the stocker 110 that a purging process is not performed against occupied shelves among all of the shelves 112, on which the containers 10 are loaded so that the purging unit 120 does not purge the containers 10. That is, in the normal mode, the purging unit 120 may provide the purge gas only to empty shelves among all of the shelves 112. Accordingly, the purge quality inspection process is not performed against the occupied shelves in the normal mode, whereas the purge quality inspection process is performed against the empty shelves in the normal mode. That is, the inspection unit 110 may inspect the purge quality against only the empty shelves among all of the shelves 112.

The control unit 140 may control the transfer robot 113 of the stocker 110 to transfer the containers 10 on which are positioned on the occupied shelves to transform the occupied shelves into new empty shelves. When the new empty shelves are transformed from the occupied shelves, the inspection unit 110 may inspect the purge quality against the new empty shelves. Therefore, the inspection unit 110 may sequentially perform the purge quality inspection process against all of the shelves 112.

The inspection unit 130 may inspect the purge quality for the empty shelves at a period of a predetermined time. If the occupied shelves are not transformed to the new empty shelves after the lapse of the predetermined time, the control unit 140 controls the transfer robot 113 to transfer the containers 10 from the occupied shelves to transform the occupied shelves into the new empty shelves.

To change the occupied shelves to the new empty shelves, the transfer robot 113 may transfer the containers 10 of the occupied shelves either to the empty shelves on the condition that the inspection unit 130 has completed the purge quality inspection process against the empty shelves, or to the outside of the stocker 110 via the load port 111.

The control unit 140 may classify all of the shelves 112 into a plurality of shelf groups. In each of the shelf groups, the flow control unit 126 controls a flow rate of the purge gas which flows into the shelves 112 included into each of the shelf group. Also, the inspection unit 130 may perform the purge quality inspection process for one of the shelf groups selected from among the shelf groups at a regular interval under the control of the control unit 140.

The control unit 140 may select the shelf group from the plurality of the shelf groups according to priority criteria. The priority criteria may be set in order of the largest number of shelves including a specific shelf group or the largest number of empty shelves in the specific shelf group.

The display unit 150 displays whether each of the shelves 112 of the stocker 110 is in the purge mode or the normal mode according to a control signal of the control unit 140. The display unit 150 displays whether the purge quality inspection process is performed against one of the shelves 112, and what the inspection result is. Also, the display unit 150 may mark the shelves 112 for which the purge quality is determined to be abnormal as unusable. Accordingly, an operator may easily and accurately check a state of the stocker 110 with monitoring the display unit 150.

Figure 5:
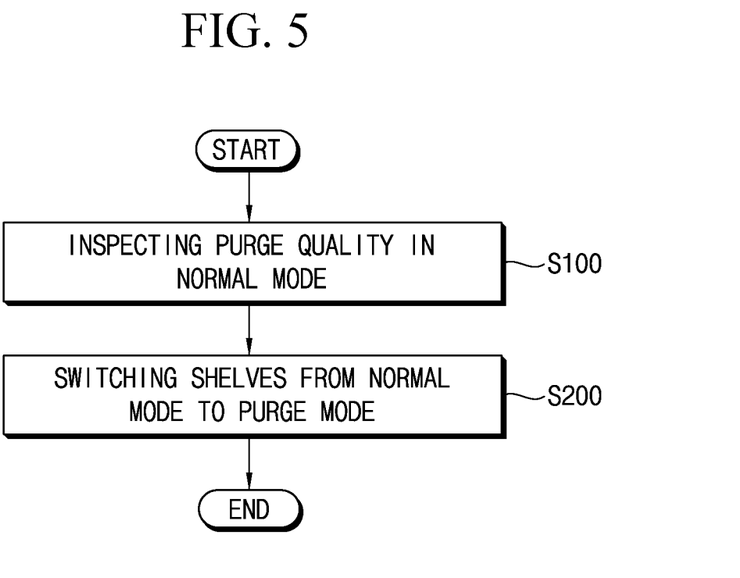
FIG. 5 is a flow chart illustrating a method of storing carriers with an example embodiment of the present invention.
Figure 6:
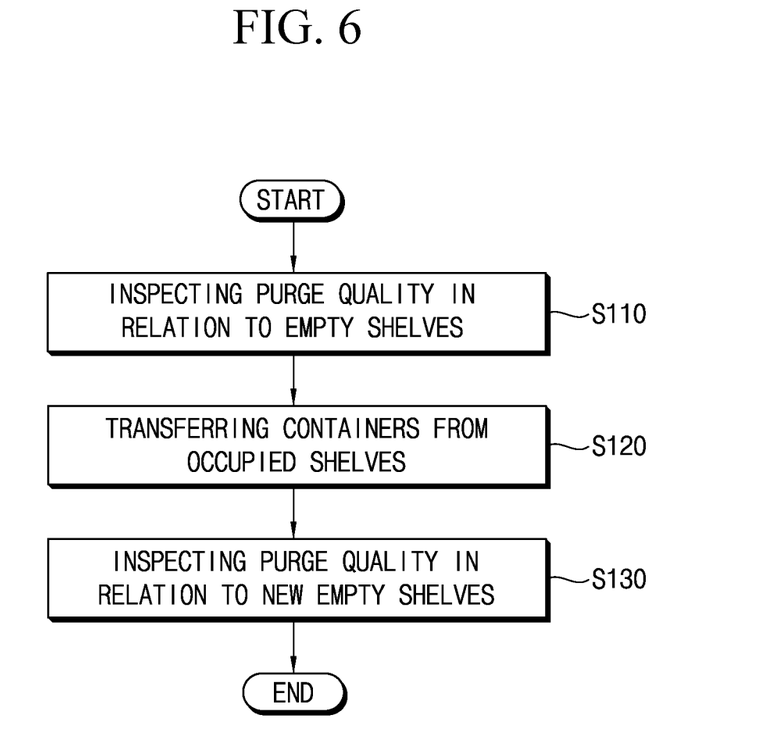
FIG. 6 is a flow chart illustrating the step of inspecting a purge quality in FIG. 5.
Figure 7:
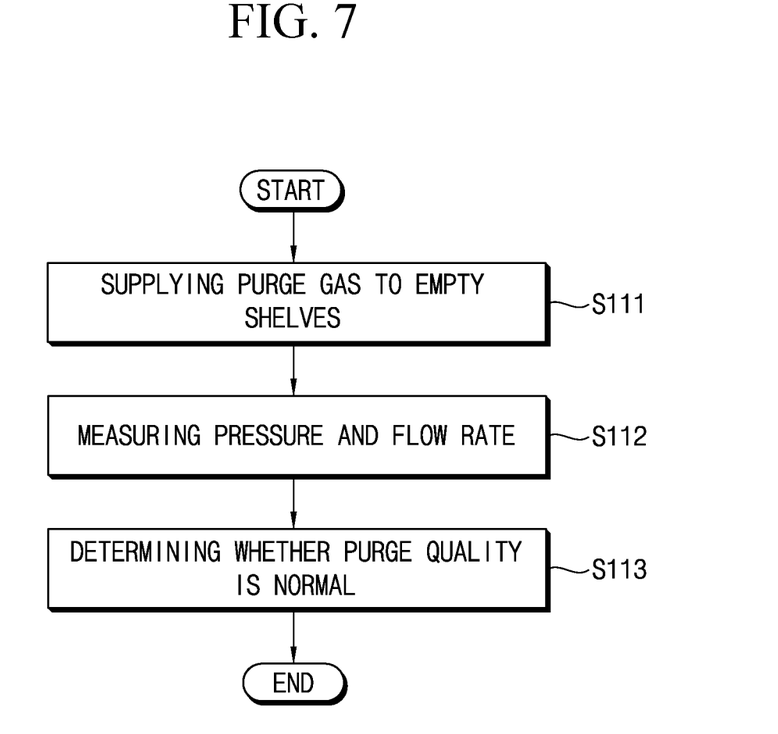
FIG. 7 is a flow chart illustrating the step of inspecting a purge quality against empty shelves in FIG. 6.

FIG. 5 is a flow chart illustrating a method of storing carriers with an example embodiment of the present invention. FIG. 6 is a flow chart illustrating the step of inspecting a purge quality in FIG. 5. FIG. 7 is a flow chart illustrating the step of inspecting a purge quality against empty shelves in FIG. 6.

Referring to FIGS. 1 to 3 and 5, according to an example embodiment of a method of storing carriers, a purge quality inspection process is performed against all of shelves 112 for storing the container 10 in a normal mode, whereas a purging process is not performed on all of the shelves 112 included into the stocker 110 (step S100).

In the normal mode, a purge gas is provided only into the shelves 112 included in the stocker 110 and not into the container 10. While performing the purge quality inspection process, the purge gas is provided for each of the shelves 112 to inspect the purge quality for each of the shelves 112.

In order to prevent a purging unit 120 from purging the containers 10 in the normal mode, the purging unit 120 does not provide the purge gas into occupied shelves among the shelves 112, on which the containers 10 are loaded. That is, in the normal mode, the purge gas may be provided only to empty shelves among all of the shelves 112. Accordingly, the purge quality inspection process is not performed against the occupied shelves in the normal mode, whereas an inspection unit 130 inspects the purge quality for only each of the empty shelves.

Specifically, referring to FIG. 6, in order to inspect the purge quality of each of the shelves 112, first, a purge quality of each of empty shelves among the shelves 112, is inspected (step S110).

Among the shelves 112, the containers 10 which are loaded to occupy the occupied shelves are transferred to transform the occupied shelves to new empty shelves S120.

Specifically, the purge quality inspection process may be performed against the empty shelves for a period of a predetermined time. When the occupied shelves are not changed to the new empty shelves for the predetermined time, the transfer robot 113 of the stocker 110 transfers the containers 10 which occupy the occupied shelves to transform the occupied shelves to the new empty shelves.

In order to transform the occupied shelves to the new empty shelves, the transfer robot 113 of the stocker 110 transfer the containers 10 from the occupied shelves to the empty shelves against which the purge quality inspection process is finished to complete. Otherwise, the transfer robot 113 may transfer the containers 10 from the occupied shelves to the outside of the stocker 110 through the load port 111.

Then, a purge quality is inspected against the new empty shelves (step S130).

When the purge quality inspection process is performed against each of the shelves 112, the shelves are classified into a plurality of shelf groups. The purge quality inspection process is performed against the shelves included in a selected shelf group among the shelf groups for a period of a predetermined time.

For example, each of flow control units 126 may control the purge gas to be provided for all of the shelves included in each shelf group.

Each of the shelf groups is sequentially selected for providing the purge gas for one of the shelf group according to priority criteria. The priority criteria may be set in order of the largest number of shelves constituting a specific shelf group or the largest number of empty shelves in the specific shelf group.

Referring to FIGS. 3 and 7, a process (step S110) of inspecting the purge quality for the empty shelves is described as follows.

First, a purge gas for performing the purge is supplied to the empty shelves (step S111).

Specifically, the purge gas may be supplied from a gas supply unit 125 to the empty shelves through supply pipes 123 and the supply nozzles 121.

Both a pressure and a flow rate of the purge gas provided to the empty shelves are measured (step S112).

In detail, pressure sensors 131 measure the pressure of the purge gas provided to the each of the shelves 112, and flow sensors 133 measure the flow rate of the purge gas provided to the each of the shelves 112.

When values of both the pressure and the flow rate of the purge gas measured on the empty shelves are within a normal range, a purge quality of each of the empty shelves is determined to be normal, and when the values of the pressure and the flow rate are out of the normal range, the purge quality of each of the empty shelves is determined to be abnormal (step S113).

A purge quality inspection process against the new empty shelves S130 is substantially the same as the purge quality inspection process against the empty shelves (step S110).

When the purge quality inspection process for each shelf 112 is completed, the purge quality inspection result is provided to the control unit 140.

The stocker 110 is changed from the normal mode to a purge mode S200. In a purge mode, a purging process is performed against carriers which the shelves support according to the purge quality inspection results of the respective shelves.

Only the shelves 112 for which the purge quality is determined to be normal may be changed from the normal mode to the purge mode. Since the shelves 112 each of which the purge quality is determined to be abnormal, respectively cannot purge the container 10 properly, the shelves 112 each of which the purge quality is determined to be abnormal are not changed to the purge mode such that the shelves may either maintain the normal mode or be unavailable.

Since the purge quality inspection result of each of the shelves 112 is utilized, the stocker 100 may not be required to stop when changing the stocker 110 from the normal mode to the purge mode. Therefore, the stocker 110 may have improved operation efficiency thereof.

Further, the stocker 110 may be quickly switched from the normal mode to the purge mode without an additional purge quality inspection. Accordingly, a time and a cost required for the purge quality inspection may be saved.

According to the apparatus and method of storing container in example embodiments of the present invention, it is possible to quickly change the stocker from the normal mode to the purge mode by using the purge quality inspection result conducted by the inspection unit while the stocker is in the normal mode. Since the stocker is not required to stop for performing the purge quality inspection process, the stocker may have improved operation efficiency thereof Further, when changing the stocker from the normal mode to the purge mode, the additional purge quality inspection process may be omitted such that the time and cost required for the purge quality inspection process may be saved.

Although the example embodiments of the present invention have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. An apparatus of storing carriers, the apparatus comprising:
   a stocker including a plurality of shelves being configured to support containers, respectively;
   a purging unit being configured to provide a purge gas for each of the shelves to purge the containers loaded on the shelves when the stocker is in a purge mode, and not to purge the containers loaded on the shelves when the stocker is in a normal mode;
   an inspection unit being configured to inspect a purge quality of the purge gas for each of the shelves while the stocker is in the normal mode; and
   a control unit controlling the purging unit so that the stocker is changed from the purge mode to the normal mode or from the normal mode to the purge mode,
   wherein the control unit is configured to use a purge quality inspection result of the shelves when changing the stocker from the normal mode to the purge mode, and
   wherein the inspection unit comprises:
   a plurality of pressure sensors, each being provided in each of supply lines for supplying the purge gas to the each of the shelves and measuring a pressure of the purge gas; and
   a plurality of flow sensors, each being provided in each of the supply lines and measuring a flow rate of the purge gas.

2. The apparatus of claim 1, wherein the purging unit provides the purge gas only to empty shelves among all of the shelves, on which the containers are not loaded, respectively, to prevent the purge gas from being supplied into the containers in the normal mode.

3. The apparatus of claim 2, wherein the inspection unit inspects the purge quality in relation to the empty shelves.

4. The apparatus of claim 3, wherein the stocker includes a transfer robot being configured to transfer the carriers, the control unit controls the transfer robot to transfer the containers loaded on occupied shelves from the occupied shelves to transform the occupied shelves to new empty shelves, and the inspection unit further inspects the purge quality in relation to the new empty shelves.

5. The apparatus of claim 4, wherein the inspection unit inspects the purge quality in relation to the empty shelves for a predetermined period of time,
   and in case when the occupied shelves are not transformed to the new empty shelves for the predetermined period of time, the control unit controls the transfer robot to transfer the containers from the occupied shelves.

6. The apparatus of claim 4, wherein transforming the occupied shelves to new empty shelves includes transferring the containers from the occupied shelves either to the empty shelves where the inspection unit completes a purge quality inspection process, or out of the stocker.

7. The apparatus of claim 1, wherein the inspection unit further comprises:
   a plurality of determiners, each being configured to determine whether the purge quality in relation to the each of the shelves is normal in case when each of values of the pressure and the flow rate of the purge gas is within a normal range.

8. The apparatus of claim 1, wherein the control unit classifies the shelves into a plurality of shelf groups, and controls the inspection unit to inspect the purge quality against a selected shelf group at a regular interval.

9. The apparatus of claim 8, wherein the control unit selects one of the shelf groups to be inspected according to priority criteria which are set in order of either a number of shelves included in a specific shelf group or a number of empty shelves in the specific shelf group.

10. The apparatus of claim 1, further comprising a display unit being configured to display whether the stocker is either in the purge mode or in the normal mode, whether the inspection unit performs a purge quality inspection process in relation to the each of the shelves in the normal mode, and what a result of the purge quality inspection process is.

11. A method of storing carriers, the method comprising:
    inspecting a purge quality of a purge gas for each of shelves of a stocker in a normal mode in which containers loaded on the shelves are not purged;
    changing the stocker from the normal mode to a purge mode in which the purge gas is provided into containers loaded on the shelves to purge the containers by using a purge quality inspection result of the shelves; and
    inspecting a purge quality of a purge gas provided to each of shelves includes inspecting the purge quality against the shelves included in a selected shelf group at a regular interval.

12. The method of claim 11, wherein the purge gas is provided only to empty shelves among all of the shelves, on which the containers are not loaded, respectively, to prevent the purge gas from being provided into the containers in the normal mode.

13. The method of claim 12, wherein inspecting a purge quality of each of the shelves comprises:
    inspecting a first purge quality in relation to each of the empty shelves;
    transferring the containers from occupied shelves to transform the occupied shelves to new empty shelves; and
    inspecting a second purge quality in relation to the new empty shelves.

14. The method of claim 13, wherein inspecting the first purge quality in relation to empty shelves is performed for a predetermined period of time,
    and in case when the occupied shelves are not changed to the new empty shelves within the predetermined period of time, the containers are transferred from the occupied shelves to transform the occupied shelves to the new empty shelves.

15. The method of claim 13, wherein transferring the containers from the occupied shelves includes transferring the containers either to the empty shelves on the condition of completing inspecting the purge quality, or out of the stocker.

16. The method of claim 13, wherein inspecting a first purge quality in relation to each of empty shelves comprises:
    supplying a purge gas to perform a purge process to the empty shelves;

measuring a pressure and a flow rate of the purge gas provided to the empty shelves; and determining whether the purge quality in relation to the each of the empty shelves is normal in case when each of values of the pressure and the flow rate of the purge gas is within a normal range.

17. The method of claim 16, wherein when the stocker is changed from the normal mode to the purge mode, a shelf whose the purge quality is determined to be abnormal is not used.

18. The method of claim 11, wherein the shelves are classified as a plurality of shelf groups.

19. The method of claim 18, wherein the selected shelf group is decided according to priority criteria which are set in order of either a number of shelves included in a specific shelf group or a number of empty shelves in the specific shelf group.

20. A method of storing carriers, the method comprising:

inspecting a purge quality of a purge gas for each of empty shelves among shelves of a stocker in a normal mode in which containers loaded on the shelves are not purged;

changing the stocker from the normal mode to a purge mode in which the purge gas is provided into containers loaded on the shelves to purge the containers by using a purge quality inspection result of the empty shelves; and displaying whether the stocker is in the purge mode or the normal mode, whether a purge quality inspection process in relation to each of the shelves in the normal mode is performed, and what a result of the purge quality inspection process is.

* * * * *